United States Patent [19]

Fraisse

[11] Patent Number: 5,027,060
[45] Date of Patent: Jun. 25, 1991

[54] MEASURING DEVICE OF THE RMS VALUE OF A SIGNAL, NOTABLY FOR CURRENT MEASUREMENT IN A SOLID-STATE TRIP DEVICE

[75] Inventor: Didier Fraisse, St. Martin D'Heres, France

[73] Assignee: Merlin Gerin, France

[21] Appl. No.: 553,325

[22] Filed: Jul. 17, 1990

[30] Foreign Application Priority Data

Jul. 31, 1989 [FR] France ................. 89 10398

[51] Int. Cl.$^5$ .................... G01R 19/00; G01R 19/02
[52] U.S. Cl. ............................ 324/132; 328/144; 364/841
[58] Field of Search ............. 324/130, 132, 103 P, 324/107, 141, 142; 364/571.02, 571.06, 483, 841; 307/490; 328/141

[56] References Cited

U.S. PATENT DOCUMENTS

| | | | |
|---|---|---|---|
| 3,532,984 | 10/1970 | Wise | 328/144 |
| 3,795,868 | 3/1974 | Ohme et al. | 328/144 |
| 4,245,183 | 1/1981 | Glennon | 324/132 |
| 4,360,880 | 11/1982 | Brodie et al. | 324/132 |
| 4,472,676 | 9/1984 | Eichmann et al. | 324/603 |
| 4,603,542 | 8/1986 | Siegel | 330/282 |

FOREIGN PATENT DOCUMENTS

| | | |
|---|---|---|
| 2914389 | 10/1980 | Fed. Rep. of Germany . |
| 860681 | 2/1961 | United Kingdom . |
| 2036984 | 7/1980 | United Kingdom . |

OTHER PUBLICATIONS

Funkschau, No. 19, Sep. 1983, pp. 79–82, E. Hormannsdorfer, "Genauigkeit ist keine Hexerie".

Primary Examiner—Kenneth Wieder
Assistant Examiner—William J. Burns
Attorney, Agent, or Firm—Parkhurst, Wendel & Rossi

[57] ABSTRACT

The measuring device of the rms value of a signal comprises, in series, a full-wave rectifier, a low-pass filter, for example of the RC type, and a peak detector. The output signal of the device is representative of the rms value of the input signal, the cut-off frequency of the filter corresponding to an angular frequency comprised between $4\pi f/6$ and $4\pi f/5.33$, f being the fundamental frequency of the input signal of the device.

5 Claims, 3 Drawing Sheets

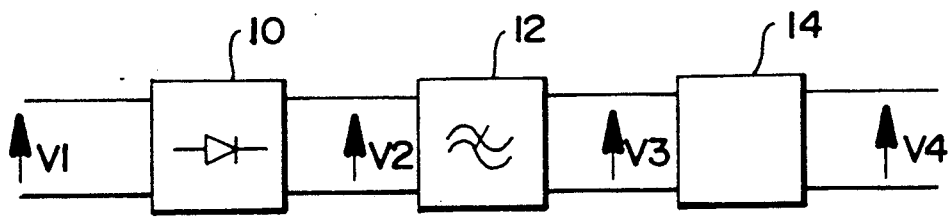
Fig_1
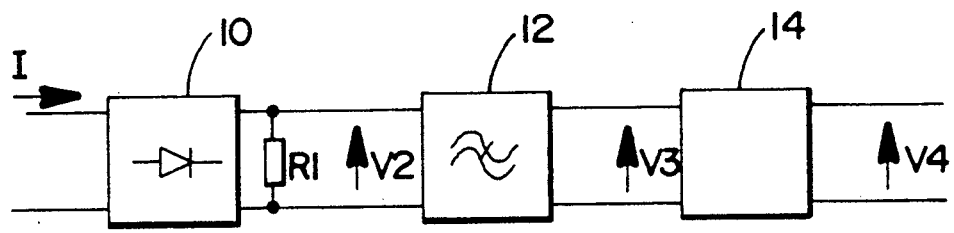
Fig_2
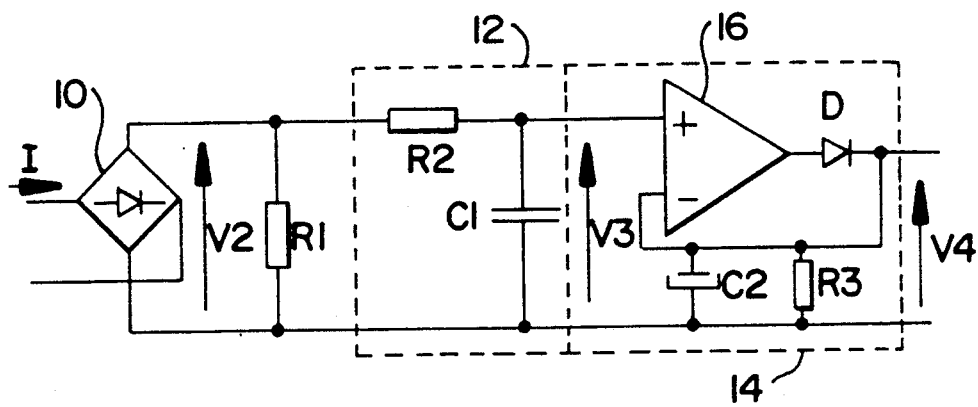
Fig_3

MEASURING DEVICE OF THE RMS VALUE OF A SIGNAL, NOTABLY FOR CURRENT MEASUREMENT IN A SOLID-STATE TRIP DEVICE

BACKGROUND OF THE INVENTION

The invention relates to a measuring device of the rms value of a signal, notably for current measurement in a solid-state trip device.

In state-of-the-art solid-state trip devices, two methods are essentially used to measure the rms value of a signal representative of a current.

According to a first method, used essentially in analog trip devices, the peak value of a signal is determined and this value is multiplied by 0.707. Although this method gives satisfactory results when the input signal is a pure sinusoidal signal, it gives rise to very large errors as soon as the input signal is disturbed.

According to a second method, used in microprocessor-based trip devices, the input signal is sampled and the rms value calculated by summing the squares of a certain number of samples. This second method, although it provides more accurate results, is relatively complex to implement and consequently expensive.

SUMMARY OF THE INVENTION

The object of the present invention is to achieve a simple and inexpensive device enabling the rms value of a signal to be determined with sufficient accuracy even in the case of a disturbed signal.

More particularly, the invention must enable a signal to be measured presenting a peak factor lower than 2.5 with a precision greater than 20%.

According to the invention this object is achieved by a device which comprises a full-wave rectifier circuit to whose input the signal to be measured is applied and whose rectified output signal is applied to the input of a first order low-pass filter, the output signal from the filter being applied to the input of a peak detector whose output voltage is representative of the rms value of the input signal, the filter cut-off angular frequency being determined in such a way as to be comprised between $4\pi f/6$ and $4\pi f/5.33$, f being the fundamental frequency of the input signal designed to be applied to the device.

According to a preferred embodiment the filter is an RC type filter.

When the signal designed to be applied to the input of the device is a signal of fundamental frequency 50 Hz, the filter is dimensioned so as to have a time constant comprised between 8.5 and 9.5 ms, and preferably equal to 9 ms.

BRIEF DESCRIPTION OF THE DRAWINGS

Other advantages and features will become more clearly apparent from the following description of illustrative embodiments of the invention, given as non-restrictive examples only and represented in the accompanying drawings, in which:

FIGS. 1 and 2 illustrate a device according to the invention in the case where the input signal is constituted respectively by a voltage and by a current.

FIG. 3 represents in greater detail a preferred embodiment of the device according to FIG. 2.

DESCRIPTION OF THE PREFERRED EMBODIMENT

In FIG. 1, the input signal V1, whose rms value is to be measured, is applied to the input of a full-wave rectifier circuit 10. The output voltage V2 of the rectifier circuit is applied to the input of a first order low-pass filter 12. The filter output voltage V3 is applied to the input of a peak detector 14 whose output voltage V4 is representative of the rms value of the input signal V1.

The circuit according to FIG. 2 differs from that of FIG. 1 in that the input signal is constituted by a current I and not by a voltage V1. A measuring resistor R1 is connected in parallel to the output of the rectifier circuit 10. The rectifier output signal V2, which is as in the previous instance a rectified signal representative of the input signal, is processed in the same way as in the circuit according to FIG. 1.

In the preferred embodiment represented in FIG. 3, the filter 12 is constituted by an RC filter comprising a resistor R2 connected between a first input and a first output of the filter and a capacitor C1 connected between first and second outputs of the filter, the second input and output of the filter being connected directly to one another. The time constant of a low-pass filter of this kind is given by $T = R2C1$.

The peak detector 14 can be constituted in any state-of-the-art manner. FIG. 3 illustrates a particular, known embodiment. In this figure, the detector is constituted by an operational amplifier 16, whose non-inverting input terminal is connected to the first output of the filter 12. Its inverting terminal is connected directly to a first output of the detector and, via a capacitor C2, in parallel with a resistor R3, to a second input of the detector, itself connected to a second output of the latter. The output of the operational amplifier is connected to the anode of a diode D whose cathode is connected to the first output of the detector. The voltage V4 present between the first and second outputs of the peak detector 14 is representative of the peak value of the voltage signal V3 applied between the detector inputs.

Operation of the device according to the invention will be explained below.

Figure 4:
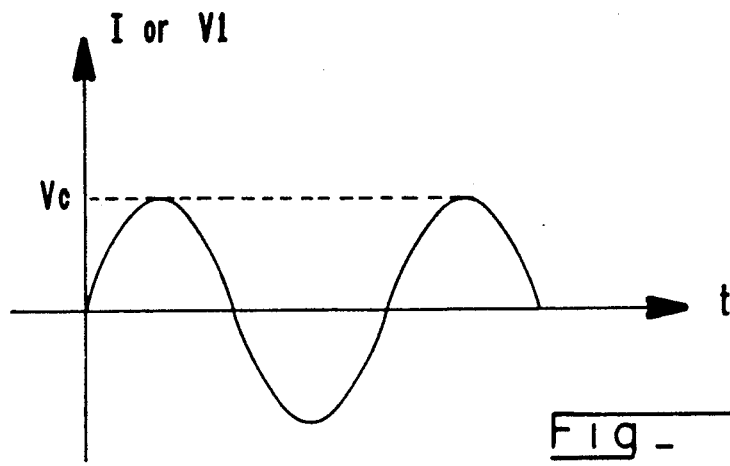
FIGS. 4 and 5 illustrate the wave shapes of the signals at various points of the device when the input signal is sinusoidal.
Figure 5:
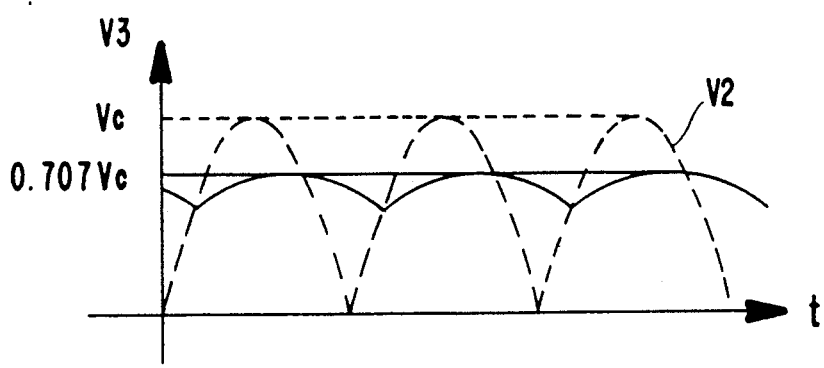

Let us assume that the input signal is a pure sinusoidal signal of 50 Hz frequency, whose peak value is represented by Vc in FIG. 4. The rectified signal V2, represented by the dotted line in FIG. 5, has the same peak value Vc.

After filtering by the filter 12, the signal V3 (FIG. 5) has a peak value equal to the rms value $Vrms = 0.707\,Vc$ of the input signal. This peak value is then detected by the peak detector 14 whose output signal 14 is representative of the rms value of the input signal V1.

The filtering time constant $T = R2C1$ of the filter 12, determined experimentally for an input signal I or V1 whose fundamental frequency is 50 Hz, is 9 ms.

Figure 7:
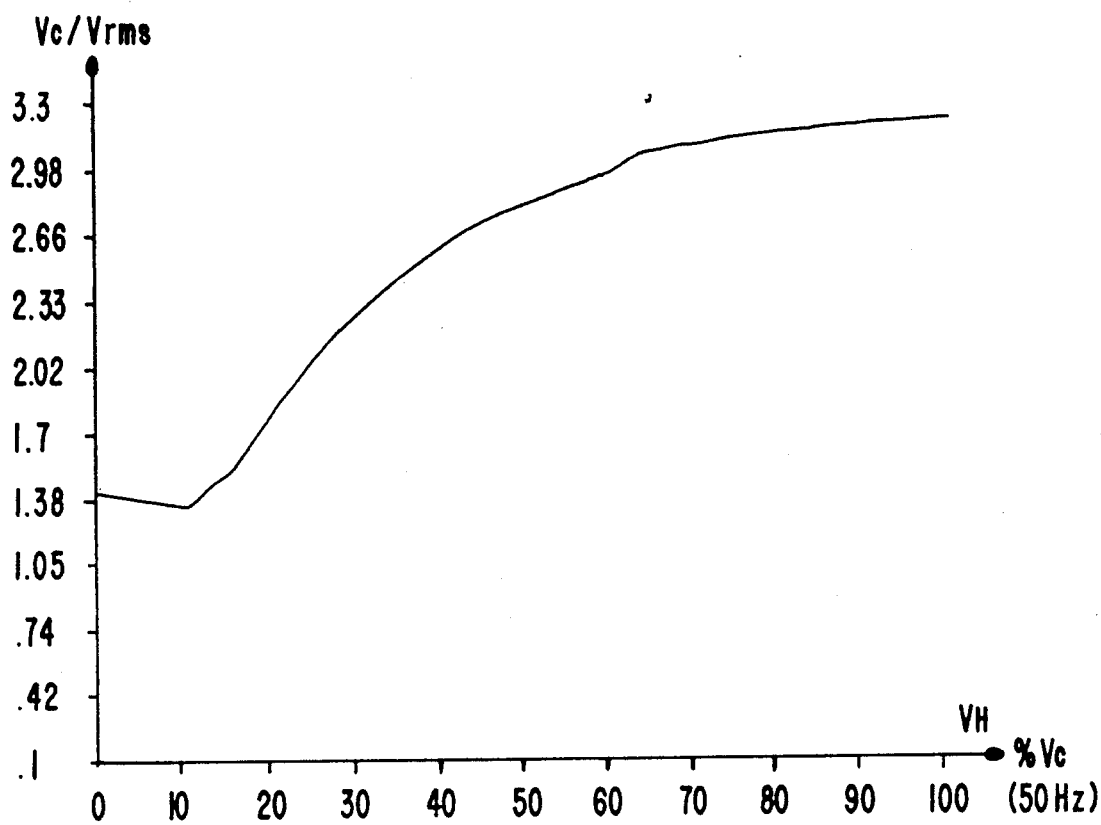
FIGS. 7 and 8 illustrate the results obtained with a device according to the invention when the odd harmonics of variable amplitude are superposed on a sinusoidal input signal.
Figure 8:
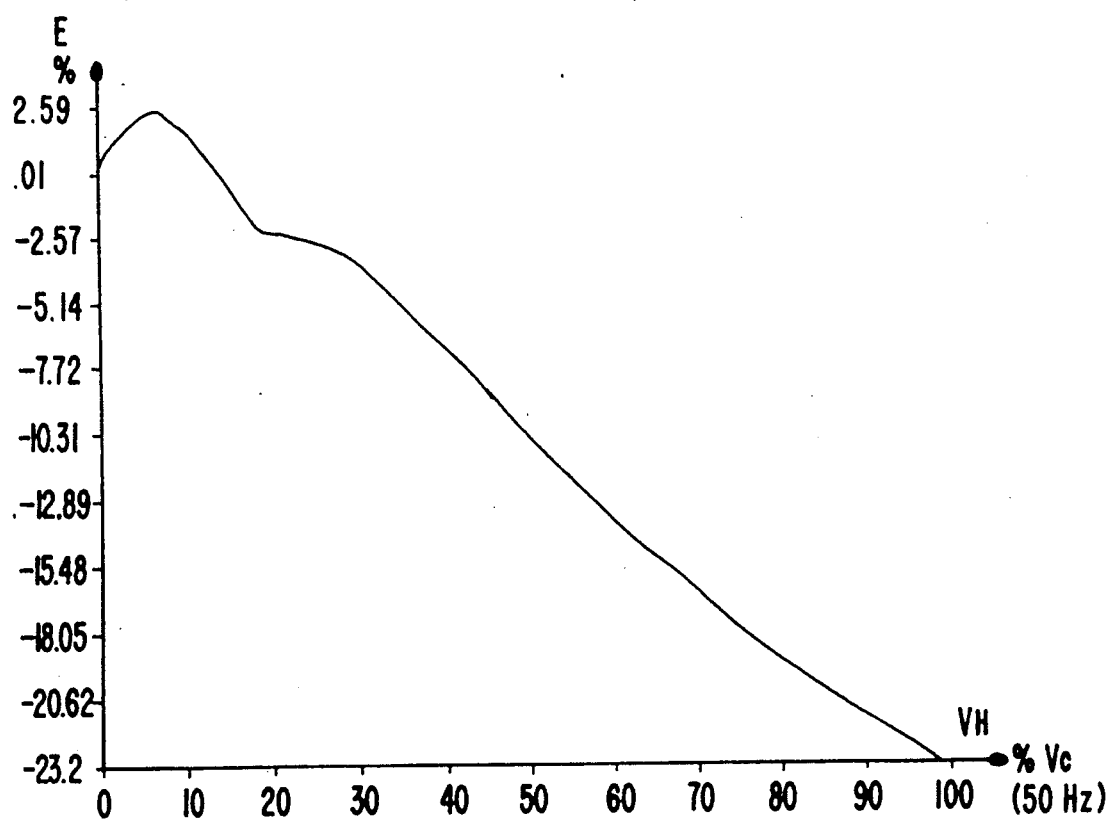

FIGS. 7 and 8 show the experimental results obtained with a filter having a time constant of 9 ms when 20 odd harmonics of the same amplitude are superposed on a sinusoidal input signal whose fundamental frequency is 50 Hz.

In FIG. 7, the peak factor Vc/Vrms is represented in terms of the percentage ratio between the amplitude (or peak value) VH of the harmonics and the amplitude (or peak value) Vc (50 Hz) of the fundamental frequency signal.

FIG. 8 represents in percentage, in terms of the same amplitude ratio, the error E committed in assimilating the peak value of the filter output signal (V4) to the true rms voltage Vrms of the input signal (fundamental and harmonics) obtained by calculation, i.e. $E = 100 \times (V4 - Vrms)/Vrms$.

It is clearly apparent from these figures that for a peak factor lower than 2.5, the error committed is less than 4.5%.

It was verified with measurements made with input signals comprising various types of harmonics that the error occurring in assimilating the output value V4 of the device according to the invention to the rms value is always less than 10% in practice. This error is moreover generally much lower than that obtained by assimilating the rms value to 0.707 times the peak value of the input signal.

As examples the following values were measured:

| Vrms | Vc | Peak factor Vc/Vrms | V4 | Filter error | Peak error |
| --- | --- | --- | --- | --- | --- |
| 0.49 | 1.12 | 2.29 | 0.462 | −5.6% | +62% |
| 0.616 | 1.158 | 1.88 | 0.582 | −5.4% | +33% |
| 0.496 | 1.144 | 2.30 | 0.452 | −8.73% | +63% |
| 5.693 | 7.33 | 1.28 | 5.24 | −7.86% | −9% |
| 0.636 | 1 | 1.57 | 0.583 | −8.38% | +11.2% |
| 0.745 | 1.334 | 1.79 | 0.697 | −6.4% | +27% | with a filter error $E = 100 (V4 - Vrms)/Vrms$ and a peak error given by $100 (0.707 Vc - Vrms)/Vrms$.

The invention is not limited to measurement of the rms value of an input signal whose fundamental frequency is 50 Hz.

The formulas below enable an approximate value of the filtering time constant to be calculated as a function of the fundamental frequency of the input signal.

Indeed, for a sinusoidal input signal, the rectified signal V2 can be broken down into a series of the type: $V2 = Vc (0.636 + 0.425 \cos 2\omega t - 0.085 \cos 4\omega t + 0.036 \cos \omega t \ldots)$ in which $\omega = 2\pi f$ is the angular frequency corresponding to the frequency of the sinusoidal input signal of the rectifier.

Figure 6:
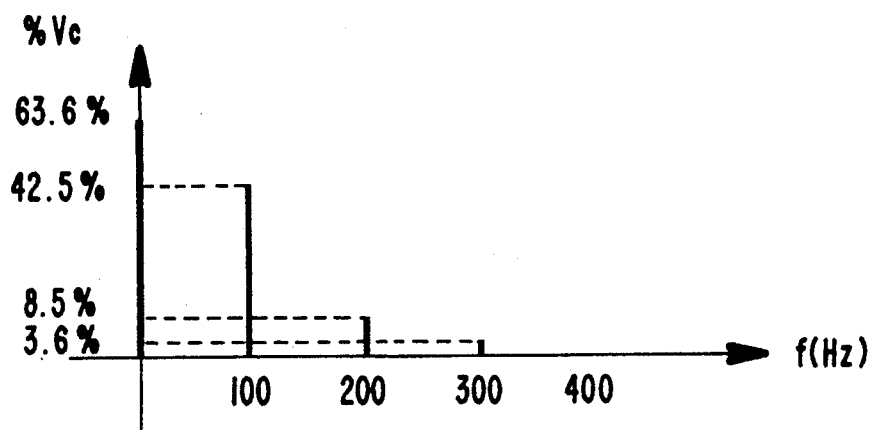
FIG. 6 represents, in terms of the frequency, the relative amplitude of the various components of a rectified sinusoidal signal whose frequency is 50 Hz.

As represented in FIG. 6, the signal V2 is then broken down into a DC signal whose amplitude corresponds to 63.6% of the peak value of the input signal, i.e. the mean value of input signal, a first component corresponding to harmonic 2 (100 Hz) of the fundamental frequency (50 Hz) of the input signal and whose amplitude corresponds to 42.5% of the peak value of the input signal, a second component corresponding to harmonic 4 (200 Hz) and whose amplitude, as an absolute value, is equal to 8.5% of the peak value, the amplitude of the following components progressively decreasing.

The rms value of the input signal $Vrms = 0.707 Vc$ is equal to the rms value of the rectified signal and the square of the rms value is equal to the sum of the squares of the rms values of the various signal components.

Thus, the rms value of the DC component of the signal V2 is given by 0.636 Vc. The error is then $(0.636 - 0.707) Vc/0.707 Vc = -0.1$, i.e. −10% in comparison with the true rms value of the input signal.

It can be shown that the rms value of a signal made up of the DC component and the first component (harmonic 2) is 0.703 Vc, i.e. an error of −0.56%.

For a signal made up of the DC component and the first two components (harmonics 2 and 4), the rms value is 0.706 Vc, i.e. an error of $-1°/_{oo}$.

If each of the components is assigned a gain representing the relationship between its contribution to the rms value and the amplitude of the component, the following values are obtained:

| Component | Amplitude (x Vc) | Contribution to the rms value (x Vc) | Gain |
| --- | --- | --- | --- |
| DC | 0.636 | 0.636 | 1 |
| 1st component | 0.425 | 0.703−0.636 = 0.067 | 0.067/0.425 = 0.158 |
| 2nd component | 0.085 | 0.706−0.703 = 0.003 | 0.003/0.085 = 0.035 |

The rms value of the input signal can therefore be obtained by assigning an appropriate gain to each of the components of the rectified signal and performing the sum of the signals thus obtained. Yet the gain which is unitary at zero frequency, decreases very quickly as the frequency of the component increases.

According to a first approximation, the result sought for is obtained by means of a first order low-pass filter. A filter of this kind has a transfer function, depending on the frequency (angular frequency $\omega 1$), of the type $F = 1/(1 + \omega 1/\omega c)$, in which $\omega c$ is the filter cut-off angular frequency. For the first component, i.e. when $\omega 1 = 2\omega = 2\pi \times 2f = 4\pi f$, f being the fundamental frequency (for example 50 Hz) of the input signal, the filter transfer function must be equal to 0.158:

$$0.158 = 1/(1 + 4\pi f/\omega c)$$

therefore $$1 + 4\pi f/\omega c = 1/0.158 = 6.33$$

$$\omega c = 4\pi f/5.33 \text{ and } T = 5.33/4\pi f.$$

If we consider the second component (harmonic 4), the transfer function is then $$F = 1/(1 + 10.66) = 0.085.$$

It can be noticed that this transfer function is too large in comparison with the gain that should be assigned to this component, i.e. 0.035, and leads, if the DC component and the first two components are considered, to a measured value of 0.710 Vc, corresponding to an error of +0.42%.

Likewise, this cut-off frequency value leads to a transfer function of 0.059 for the 3rd component (harmonic 6), i.e. a contribution to the measured value of $0.059 \times 0.036 Vc = 0.002 Vc$, increasing the error still further.

With this first approximation, the contribution of the DC component and of the first component corresponding to 0.703 Vc, the contribution of the 2nd, 3rd and 4th components is 0.01 Vc, whence an error of +0.85% in the case of a pure sinusoidal signal.

To reduce this error if the contribution of the first component, which remains preponderant, is reduced accordingly this contribution is then (0.707−0.636−0.01)Vc=0.061 Vc, corresponding to a transfer function F=0.061/0.425=0.143 for the first component, i.e. a ratio $4\pi f/\omega c=6$ and $T=6/4\pi f$.

Naturally, with the increase of this ratio $4\pi f/\omega c$, the contribution of the other components is also reduced, to 0.0065 Vc for the 2nd component, 0.0019 Vc for the 3rd component and 0.0008 Vc for the 4th component, whence a value V4 corresponding to 0.706 Vc, i.e. $-1°/_{oo}$ error.

For the error to be minimal in the case of a sinusoidal input signal without harmonics, the contribution of the 1st component must not be reduced beyond this value. The precision finally achieved depends on the disturbance of the measured signal.

For a sinusoidal input signal of 50 Hz, the filter cut-off frequency would correspond with the first approximation to an angular frequency $\omega c=4\pi \times 50/5.33=117$ Hz i.e. a filtering time constant $T=1/\omega c=8.5$ ms and, after maximum correction to an angular frequency: $\omega c=4\pi \times 50/6$, i.e. a filtering time constant of 9.5 ms.

These values are in close compliance with the experimentally determined value (9 ms), which takes account of the fact that the error must be less than 2.5, whatever the shape of the input signal, i.e. whatever the number and amplitude of the harmonics superposed on the fundamental signal.

The filtering time constant being thus determined it is easy to choose suitable values for the for the resistor R2 and capacitor C1 of the filter 12, such that T=R2C1.

The device described above also gives a value representative of the rms value in the case where the input signal is a DC signal, or a rectangular signal. Indeed, in this case the rectified signal is a DC signal and the filter output signal has the same amplitude as the input signal, this amplitude being representative of the rms value of the input signal.

Although the invention has been described with an RC type filter, it is clear that it can be implemented using any filter having a suitable cut-off frequency, notably using numerical filters or switched capacitor filters.

In solid-state trip devices the signal to be measured, supplied by the secondary winding of a current transformer, is a signal of fundamental frequency 50 Hz or 60 Hz. The device described above makes it possible to obtain, with very simple means, a value representative of the rms value of the signal to be measured, which can be used, in a known manner, by the trip device to supply a tripping signal to a circuit breaker when the measured rms value exceeds a certain threshold.

I claim:

1. A measuring device of the rms value of a signal, notably for current measurement in a solid-state trip device, comprising a full-wave rectifier circuit to whose input the signal to be measured is applied and whose rectified output signal is applied to the input of a first order low-pass filter, the output signal from the filter being applied to the input of a peak detector whose output voltage is representative of the rms value of the input signal, the filter cut-off angular frequency being determined in such a way as to be between $4\pi f/6$ and $4\pi f/5.33$, f being the fundamental frequency of the input signal designed to be applied to the device.

2. The device according to claim 1, wherein the input signal being a current, a resistor is connected in parallel to the output of the rectifier circuit.

3. The device according to claim 1, wherein the filter is an RC filter, whose components are dimensioned in such a way that the time constant of the filter is between $5.33/4\pi f$ and $6/4\pi f$.

4. The device according to claim 3, wherein the input signal of the device having a fundamental frequency of 50 Hz, the time constant of the filter is between 8.5 and 9.5 ms.

5. The device according to claim 4, wherein the time constant of the filter is equal to 9 ms.

* * * * *